United States Patent
Wang

(10) Patent No.: US 8,049,536 B2
(45) Date of Patent: Nov. 1, 2011

(54) HALF-POWER BUFFER AMPLIFIER

(75) Inventor: Chen-Yu Wang, Tainan (TW)

(73) Assignee: Himax Technologies Limited, Tainan County (TW)

( * ) Notice: Subject to any disclaimer, the term of this patent is extended or adjusted under 35 U.S.C. 154(b) by 5 days.

(21) Appl. No.: 12/628,212

(22) Filed: Nov. 30, 2009

(65) Prior Publication Data

US 2011/0128047 A1 Jun. 2, 2011

(51) Int. Cl.
*H03K 5/153* (2006.01)
(52) U.S. Cl. ............... 327/72; 327/73; 327/82; 327/108
(58) Field of Classification Search .................... 327/87, 327/89, 108, 72
See application file for complete search history.

(56) References Cited

U.S. PATENT DOCUMENTS

2008/0169847 A1* 7/2008 Takenaka .................. 327/108

* cited by examiner

*Primary Examiner* — Lincoln Donovan
*Assistant Examiner* — John Poos
(74) *Attorney, Agent, or Firm* — Stout, Uxa, Buyan & Mullins, LLP

(57) ABSTRACT

A half-power buffer amplifier includes a buffer stage having a first-half buffer stage and a second-half buffer stage. An output of the first-half buffer stage is controllably fed back to a rail-to-rail differential amplifier, and an output of the second-half buffer stage is controllably fed back to the rail-to-rail differential amplifier. A switch network controls the connection between the outputs of the buffer stage and an output node of the half-power buffer amplifier in a manner such that a same pixel, with respect to different frames, of a display panel is driven by the same rail-to-rail differential amplifier.

18 Claims, 7 Drawing Sheets

HALF-POWER BUFFER AMPLIFIER

BACKGROUND OF THE INVENTION

1. Field of the Invention

The present invention generally relates to a buffer amplifier, and more particularly, to a half-power buffer amplifier adaptable to a liquid crystal display (LCD).

2. Description of Related Art

A liquid crystal display (LCD) typically includes rows and columns of picture elements (or pixels) arranged in matrix form. Each pixel includes a thin film transistor (TFT) and a pixel electrode formed on a substrate (or panel). The gates of the TFTs in the same row are connected together through a gate line, and controlled by a gate driver (or scan driver). The sources of the TFTs in the same column are connected together through a source line, and controlled by a source driver (or data driver). A common electrode is formed on another substrate (or panel). A liquid crystal (LC) layer is sealed between the pixel electrode substrate and the common electrode substrate, and for each pixel the voltage difference between the pixel electrode and the common electrode determines the display of the pixel(s).

As the resolution of the LCD increases, thousands of output buffer amplifiers or buffer circuits should be built into the source driver. As a result, the LCD, particularly the large-size and/or high-resolution LCD, consumes immense power. On the other hand, as the power is precious to any portable electronic device with such an LCD, the power consumption of the LCD therefore tends to determine the available run time of the entire portable electronic device. Accordingly, an LCD with low-power buffer amplifiers is becoming indispensable, and some schemes, such as half-power buffer amplifiers have been proposed.

FIGS. 1A-1B show conventional half-power buffer amplifiers 10 and 12. Regarding the display of a first frame, referring to FIG. 1A, the amplifier 10 for the first channel CH1 generates the first half power (e.g., VDD to VDD/2) as the output OUT1 through a switch S1 (as indicated by the solid arrow). At the same time, the amplifier 12 for the second channel CH2 generates the second half power (e.g., VDD/2 to ground) as the output OUT2 through a switch S4 (as indicated by the solid arrow).

Subsequently, regarding the display of a second frame, the amplifier 12 for the second channel CH2 generates the second half power (e.g., VDD/2 to ground) as the output OUT1 through a switch S3 (as indicated by the dashed arrow). At the same time, the amplifier 10 for the first channel CH1 generates the first half power (e.g., VDD to VDD/2) as the output OUT2 through a switch S2 (as indicated by the dashed arrow).

As shown in FIG. 2, during the display of the first frame, the output OUT1 is used to drive the first row of the LCD, and the output OUT2 is used to drive the second row of the LCD. Subsequently, during the display of the second frame, the output OUT2 is used to drive the first row of the LCD, and the output OUT1 is used to drive the second row of the LCD. In other words, the same pixel (such as the circled pixel shown in FIG. 2) with respect to different frame(s) is driven by different amplifier(s) 10/12. As a result, the offsets incurred from different amplifiers cannot be properly cancelled, thereby degrading the display quality.

For the reason that the conventional half-power amplifiers cannot effectively cancel their offset voltages while decreasing power consumption, a need has thus arisen to propose a novel scheme or circuit in order to resolve the offset cancellation issue.

SUMMARY OF THE INVENTION

In view of the foregoing, it is an object of the embodiment of the present invention to provide a half-power amplifier that is capable of effectively improving offset cancellation while decreasing power consumption.

According to one embodiment, the half-power buffer amplifier includes a rail-to-rail differential amplifier, a buffer stage, and a switch network. The buffer stage includes a first-half buffer stage and a second-half buffer stage, wherein an output of the first-half buffer stage is controllably fed back to the rail-to-rail differential amplifier, and an output of the second-half buffer stage is controllably fed back to the rail-to-rail differential amplifier. The switch network controls the connection between the outputs of the buffer stage and an output node of the half-power buffer amplifier in a manner such that a same pixel, with respect to different frames, of a display panel is driven by the same rail-to-rail differential amplifier. In one exemplary embodiment, one buffer stage is associated with one rail-to-rail differential amplifier for each channel. In another exemplary embodiment, one buffer stage is associated with (or shared between) two rail-to-rail differential amplifiers of adjacent channels.

DETAILED DESCRIPTION OF THE INVENTION

Figure 1A:
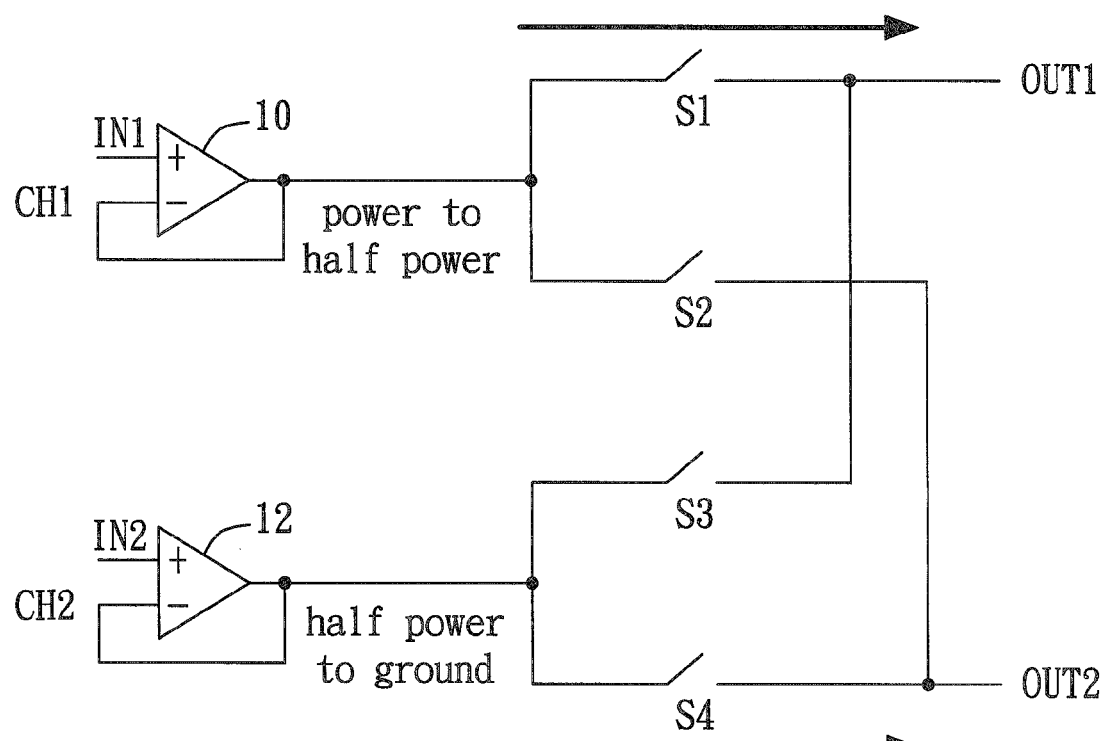
FIGS. 1A-1B show conventional half-power buffer amplifiers.
Figure 1B:
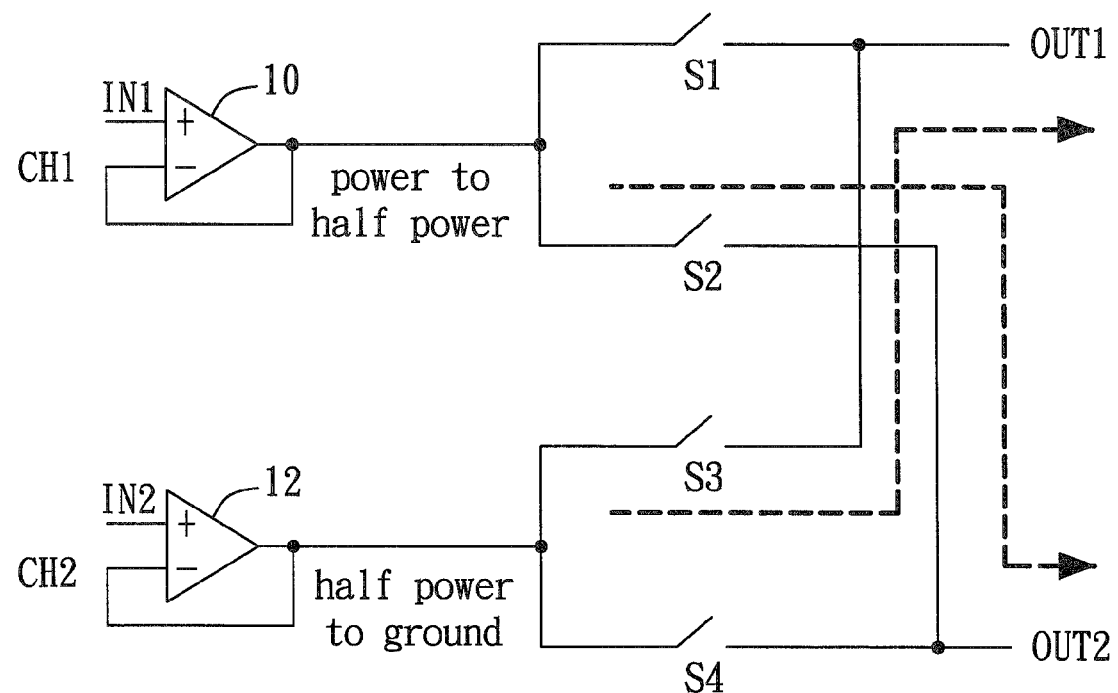
Figure 2:
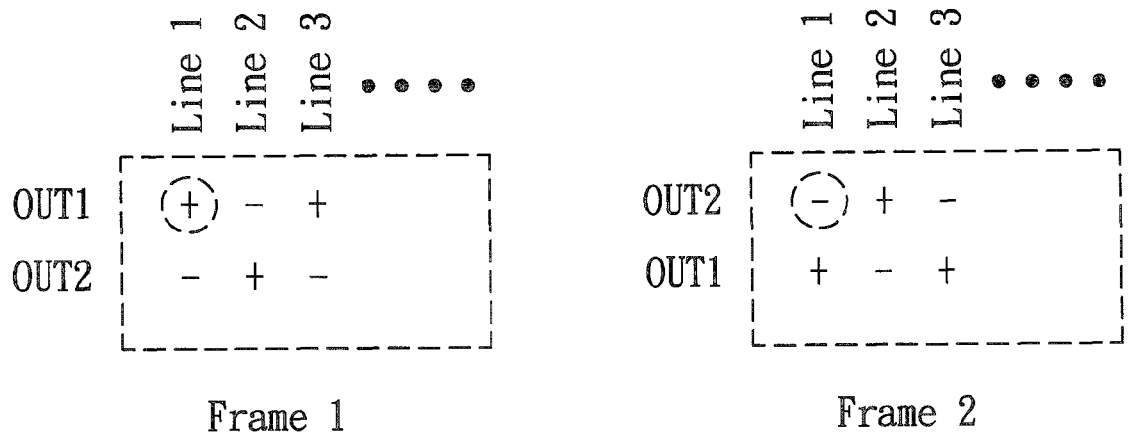
FIG. 2 shows exemplary pixels driven by the buffer amplifiers of FIGS. 1A-1B.
Figure 3:
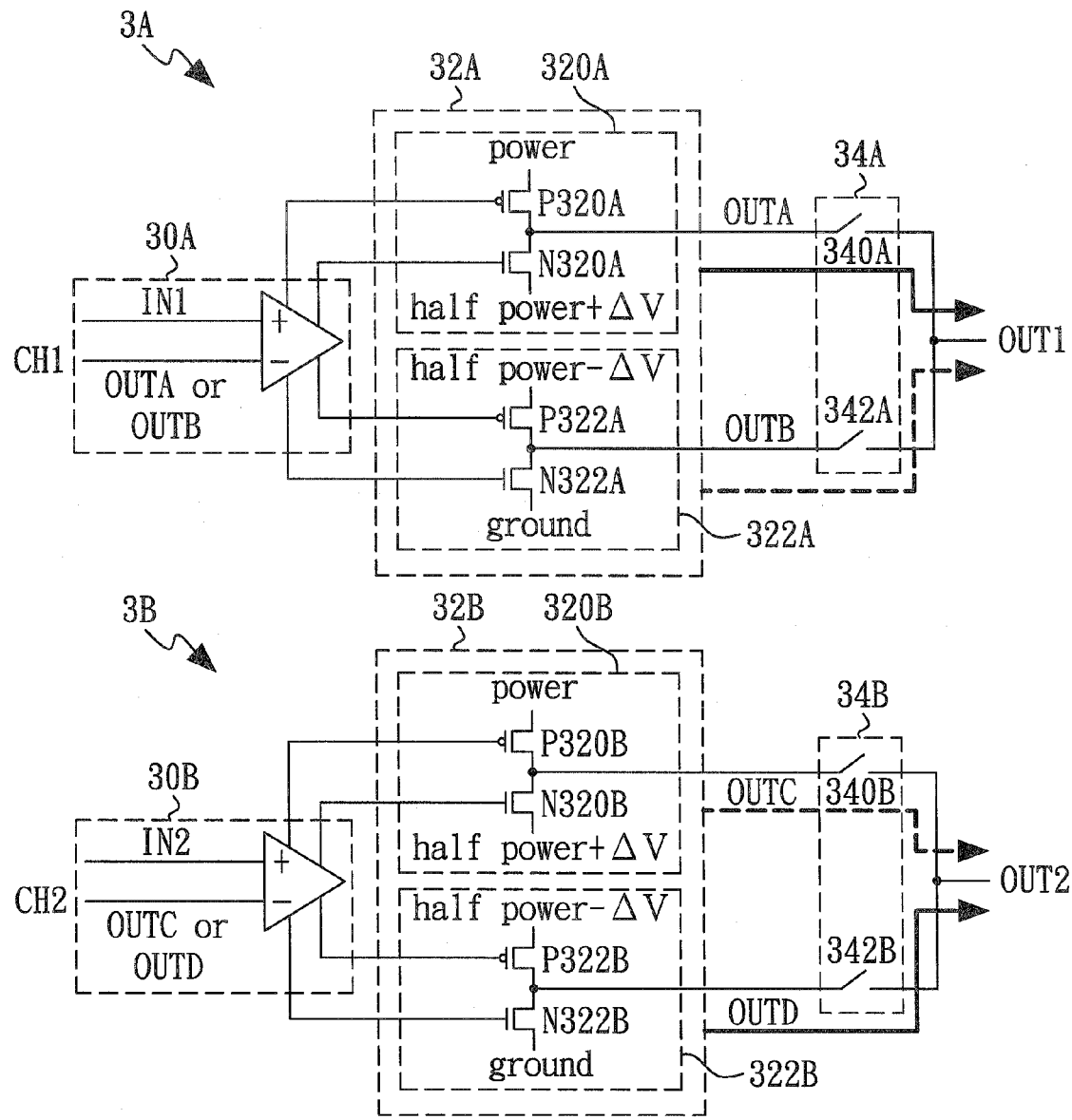
FIG. 3 shows a half-power buffer amplifier according to one embodiment of the present invention.

FIG. 3 shows a half-power buffer amplifier according to one embodiment of the present invention. Although the embodiment illustrated here is adapted to a source driver of a liquid crystal display (LCD) (now shown), it is, however, appreciated by those skilled in the pertinent art that this embodiment (and other embodiments) may be well adapted to other display panels.

Figure 4:
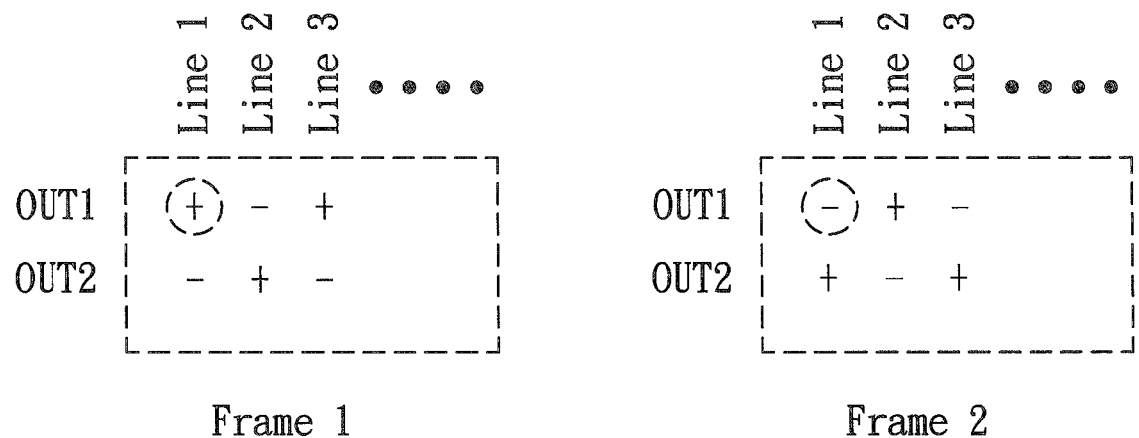
FIG. 4 shows exemplary pixels driven by the buffer amplifiers of FIG. 3.

In the embodiment, at least one half-power buffer amplifier (abbreviated as buffer amplifier hereinafter) is used in the source driver of the LCD. In the example, two buffer amplifiers, that is, a first buffer amplifier 3A and a second buffer amplifier 3B, are illustrated in the figure for two channels CH1 and CH2 respectively. As shown in FIG. 4, the output OUT1 of the first buffer amplifier 3A is utilized as an output stage of the source driver to drive the first row of the LCD, and the output OUT2 of the second buffer amplifier 3B is utilized as another output stage of the source driver to drive the second row of the LCD.

In the embodiment, the first buffer amplifier 3A includes a rail-to-rail differential amplifier (abbreviated as differential amplifier hereinafter) 30A, a buffer stage 32A and a switch network 34A. Specifically, the differential amplifier 30A includes a rail-to-rail operational amplifier (OP-Amp). In this specification, the term "rail" means the highest level (e.g., VDD) or the lowest level (e.g., ground) of a power supply. Accordingly, the rail-to-rail differential amplifier 30A is an OP-Amp that is powered by a full-range (e.g., VDD to ground) power supply, and the input voltage level is within the full range of the power supply. In another example, the full range of the power supply may be from VDD to VSS.

The buffer stage 32A includes a first-half buffer stage 320A and a second-half buffer stage 322A. With respect to the first-half buffer stage 320A, it is coupled to the power (e.g., VDD) at one end and coupled to half power plus a predetermined (non-zero) voltage $\Delta V$ (e.g., VDD/2+$\Delta V$) at the other end. The first-half buffer stage 320A generates an output OUTA that is controllably coupled to the inverting input node of the differential amplifier 30A while the non-inverting input node of the differential amplifier 30A is configured to receive an input IN1. In the embodiment, the first-half buffer stage 320A includes serial-connected P-type transistor P320A and N-type transistor N320A. Specifically, the first source/drain of the P-type transistor P320A is coupled to the power, the second source/drain of the P-type transistor P320A is coupled to the first source/drain of the N-type transistor N320A, and the second source/drain of the N-type transistor N320A is coupled to the half power plus $\Delta V$. The gate of the P-type transistor P320A and the gate of the N-type transistor N320A are under control of the differential amplifier 30A.

Similarly, with respect to the second-half buffer stage 322A, it is coupled to the half power minus a predetermined voltage $\Delta V$ (e.g., VDD/2-$\Delta V$) at one end and connected to the ground at the other end. The second-half buffer stage 322A generates an output OUTB that is controllably coupled to the inverting input node of the differential amplifier 30A. In the embodiment, the second-half buffer stage 322A includes serially-connected P-type transistor P322A and N-type transistor N322A. Specifically, the first source/drain of the P-type transistor P322A is coupled to the half power minus $\Delta V$, the second source/drain of the P-type transistor P322A is coupled to the first source/drain of the N-type transistor N322A, and the second source/drain of the N-type transistor N322A is coupled to the ground. The gate of the P-type transistor P322A and the gate of the N-type transistor N322A are under control of the differential amplifier 30A.

Figure 5:
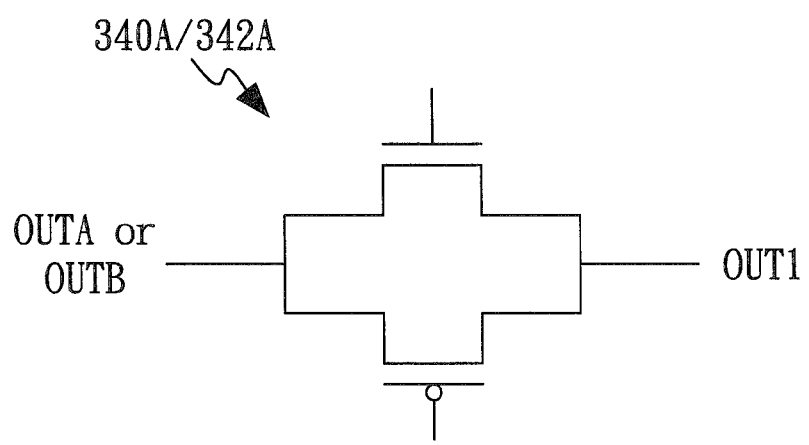
FIG. 5 shows the first switch or the second switch implemented by a transmission gate (TG)

The switch network 34A includes a first switch 340A and a second switch 342A. The first switch 340A controls the connection between the output OUTA of the first-half buffer stage 320A and the output OUT1 of the first buffer amplifier 3A; and the second switch 342A controls the connection between the output OUTB of the second-half buffer stage 322A and the output OUT1 of the first buffer amplifier 3A. The first switch 340A or the second switch 342A may be implemented by, but not limited to, a transmission gate (TG) as shown in FIG. 5.

In the same manner, the second buffer amplifier 3B for the second channel CH2 has the same composing elements and configurations as the first buffer amplifier 3A for the first channel CH1, and, therefore, same numerals are adapted except that "IN1" is replaced with "IN2," "OUTA/B" is replaced with "OUTC/D," "OUT1" is replaced with "OUT2" and all As are replaced with Bs. The description of the composing elements and their configurations are omitted for brevity.

Figure 6:
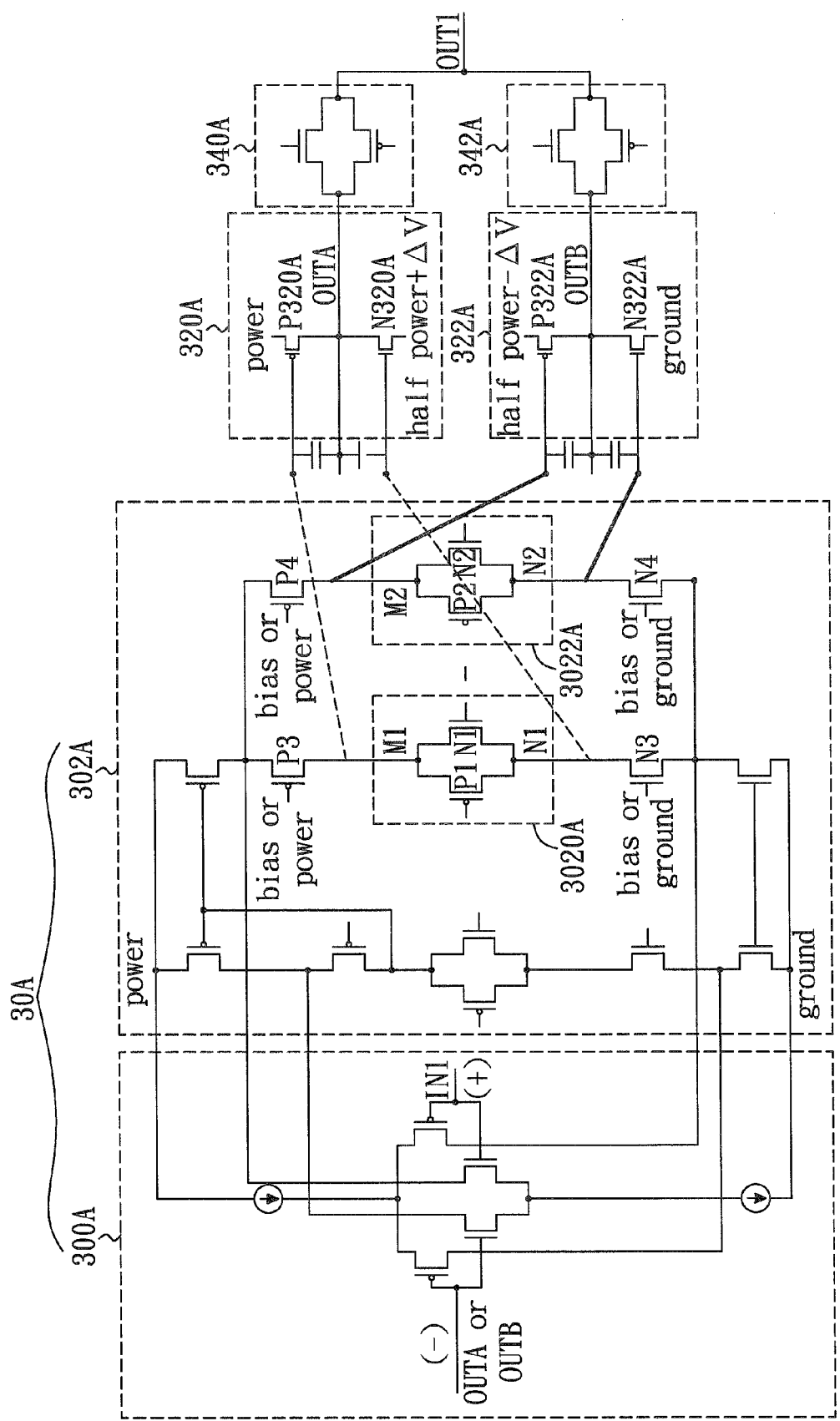
FIG. 6 shows a detailed circuit that exemplifies the half-power buffer amplifier according to the embodiment of the present invention.

FIG. 6 shows a detailed circuit that exemplifies the first buffer amplifier 3A according to the embodiment of the present invention. In the embodiment, the rail-to-rail differential amplifier 30A includes a pair of complementary differential amplifiers 300A and an amplifying stage 302A. Specifically, the complementary differential amplifiers 300A receive the input IN1 at the non-inverting input node (+), and receive the output OUTA/OUTB of the first/second-half buffer stage 320A/322A at the inverting input node (−). The amplifying stage 302A is used to amplify the voltage difference of the inputs (e.g., IN1 and OUTA/OUTB), and control the first/second-half buffer stage 320A/322A. According to one aspect of the present embodiment, the amplifying stage 302A includes a pair of floating current sources (or level shifters), that is, a first floating current source 3020A and a second floating current source 3022A, which are used to control the first-half buffer stage 320A and the second-half buffer stage 322A respectively. Specifically, in the embodiment, the first floating current source 3020A includes a parallel-connected N-type transistor N1 and P-type transistor P1 with their sources/drains respectively connected at nodes M1 and N1. The node M1 is coupled to the gate of the P-type transistor P320A of the first-half buffer stage 320A, and the node N1 is coupled to the gate of the N-type transistor N320A of the first-half buffer stage 320A. Generally speaking, the floating current source 3020A is an AB class operated circuit, in which the P-type transistor shuts off and the N-type transistor turns on when a positive current (i.e., a current flowing downward in the figure) occurs; on the other hand, the P-type transistor turns on and the N-type transistor shuts off when a negative current (i.e., a current flowing upward in the figure) occurs.

Similarly, the second floating current source 3022A includes a parallel-connected N-type transistor N2 and P-type transistor P2 with their sources/drains respectively connected at nodes M2 and N2. The node M2 is coupled to the gate of the P-type transistor P322A of the second-half buffer stage 322A, and the node N2 is coupled to the gate of the N-type transistor N322A of the second-half buffer stage 322A. In the same manner, the second buffer amplifier 3B for the second channel CH2 may have the same compositional elements and configurations as the first buffer amplifier 3A for the first channel CH1, and, therefore, description of the compositional elements and their configurations is omitted for brevity.

In the operation of the first/second buffer amplifiers 3A and 3B for the display of a first frame, referring to the first buffer amplifier 3A for the first channel CH1 in FIG. 3, the first switch 340A turns on and the second switch 342A shuts off, and, accordingly, the output OUT1 of the first buffer amplifiers 3A drives the first row of the LCD (FIG. 4) through the first switch 340A (as indicated by the solid arrow), while the path along the second switch 342A is blocked. More specifically, referring to FIG. 6, the inverting input node (−) of the complementary differential amplifiers 300A receives the output OUTA of the first-half buffer stage 320A, a P-type transistor P3 and an N-type transistor N3 (in the amplifying stage 302A) are properly biased, while a P-type transistor P4 (in the amplifying stage 302A) shuts off by connecting its gate to the power and an N-type transistor N4 shuts off by connecting its gate to the ground. In other words, the first/second floating current source 3020A/3022A shuts off and accordingly shuts off the associated buffer stage 320A/322A when the associated switch 340A/342A shuts off.

At the same time, referring to the second buffer amplifier 3B for the second channel CH2 in FIG. 3, the first switch 340B shuts off and the second switch 342B turns on, and, accordingly, the output OUT2 of the second buffer amplifiers 3B drives the second row of the LCD (FIG. 4) through the second switch 342B (as indicated by the solid arrow), while the path along the first switch 340B is blocked.

Subsequently, for the display of a second frame, referring to the first buffer amplifier 3A for the first channel CH1 in FIG. 3, the first switch 340A shuts off and the second switch 342A turns on, and, accordingly, the output OUT1 of the first buffer amplifiers 3A drives the first row of the LCD (FIG. 4) through the second switch 342A (as indicated by the dashed arrow), while the path along the first switch 340A is blocked. More specifically, referring to FIG. 6, the inverting input node (−) of the complementary differential amplifiers 300A receives the output OUTB of the second-half buffer stage 322A, a P-type transistor P4 and an N-type transistor N4 (in the amplifying stage 302A) are properly biased, while a P-type transistor P3 (in the amplifying stage 302A) shuts off by connecting its gate to the power and an N-type transistor N3 shuts off by connecting its gate to the ground.

At the same time, referring to the second buffer amplifier 3B for the second channel CH2 in FIG. 3, the first switch 340B turns on and the second switch 342B shuts off, and, accordingly, the output OUT2 of the second buffer amplifiers 3B drives the second row of the LCD (FIG. 4) through the first switch 340B (as indicated by the dashed arrow), while the path along the second switch 342B is blocked.

According to the embodiment described above, as the first-half buffer stage 320A/320B provides approximately half range (i.e., from the power to the half power+ΔV) of the entire power supply and the second-half buffer stage 322A/322B provides approximately another half range (i.e., from the half power-ΔV to the ground) of the entire power supply, the overall power consumption may thus be substantially decreased and temperature of the circuit may be accordingly lowered. Furthermore, as same pixel (such as the circled pixel shown in FIG. 4) of different frame may be driven by the same differential amplifier 30A/30B, the offset cancellation of the pixel may therefore be substantially improved.

Figure 7A:
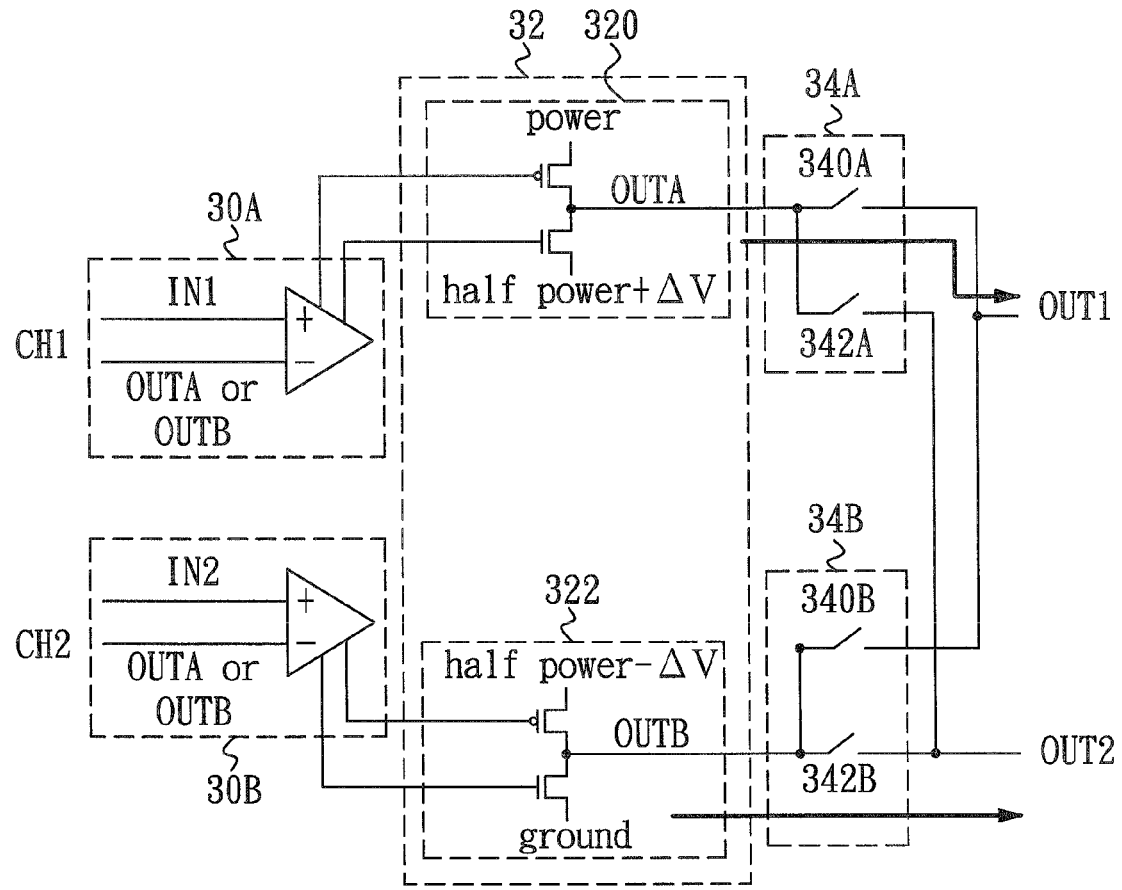
FIGS. 7A-7B show a half-power buffer amplifier according to another embodiment of the present invention.
Figure 7B:
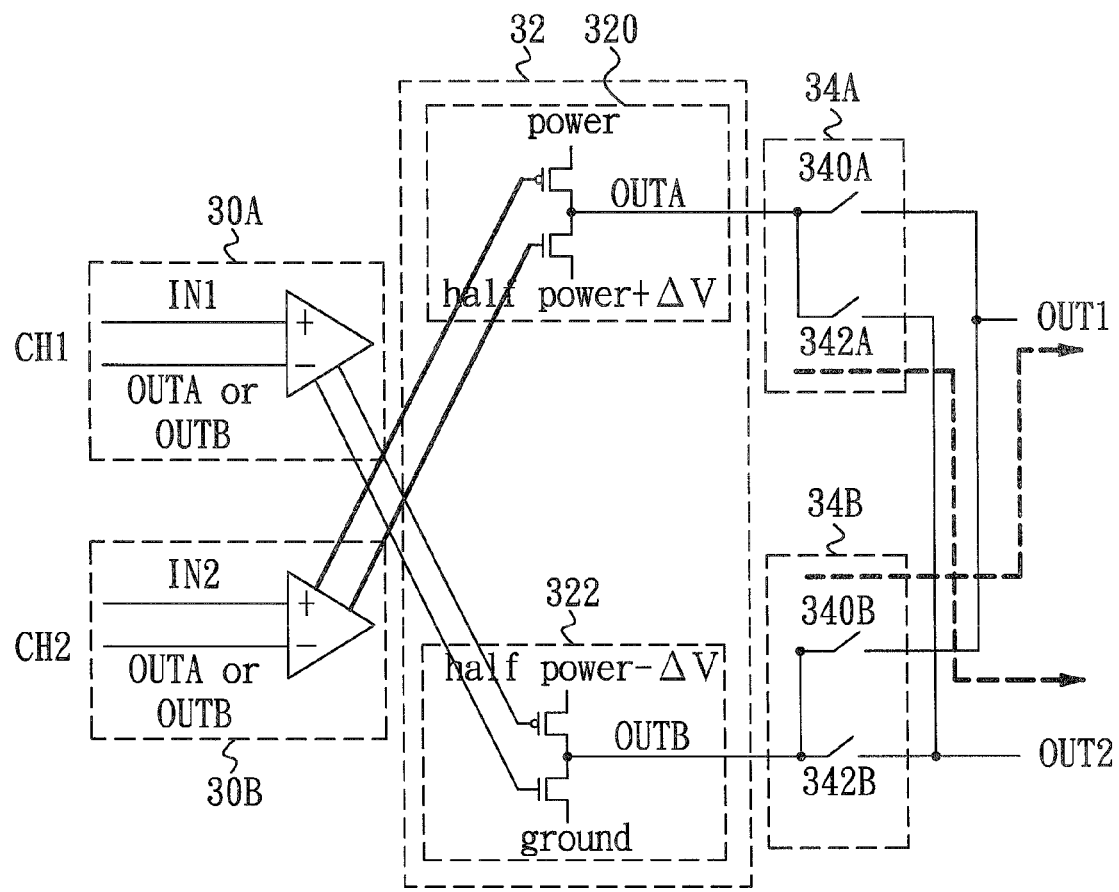

FIGS. 7A-7B show a half-power buffer amplifier according to another embodiment of the present invention. The present embodiment is similar to the previous embodiment except that a single buffer stage 32 may be shared between adjacent channels. Specifically, referring to FIG. 7A, with respect to the display of a first frame, the first-half buffer stage 320 is controlled by the differential amplifier 30A for the first channel CH1, in order to provide power, through the first switch 340A of the switch network 34A, to generate the output OUT1 (as indicated by the solid arrow). At the same time, the second-half buffer stage 322 is controlled by the differential amplifier 30B for the second channel CH2, in order to provide power, through the second switch 342B of the switch network 34B, to generate the output OUT2 (as indicated by the solid arrow).

Referring to FIG. 7B, with respect to the display of a second frame, the first-half buffer stage 320 is controlled by the differential amplifier 30B for the second channel CH2, in order to provide power, through the second switch 342A of the switch network 34B, to generate the output OUT1 (as indicated by the dashed arrow). At the same time, the second-half buffer stage 322 is controlled by the differential amplifier 30A for the first channel CH1, in order to provide power, through the first switch 340B of the switch network 34B, to generate the output OUT2 (as indicated by the dashed arrow).

The first buffer amplifier 30A or the second buffer amplifier 30B in FIG. 7A-7B may be implemented with the complementary differential amplifier 300A and the amplifying stage 302A as shown in FIG. 6. Particularly, each amplifying stage (e.g., 302A) includes, among others, a first floating current source (e.g., 3020A) and a second floating current source (e.g., 3022A). In operation, the first floating current source of the first buffer amplifier 30A turns on to control the first-half buffer stage 320 (FIG. 7A), while the second floating current source of the first buffer amplifier 30A shuts off. At the same time, the second floating current source of the second buffer amplifier 30B turns on to control the second-half buffer stage 322 (FIG. 7A), while the first floating current source of the second buffer amplifier 30B shuts off.

Subsequently, the second floating current source of the first buffer amplifier 30A turns on to control the second-half buffer stage 322 (FIG. 7B), while the first floating current source of the first buffer amplifier 30A shuts off. At the same time, the first floating current source of the second buffer amplifier 30B turns on to control the first-half buffer stage 320 (FIG. 7B), while the second floating current source of the second buffer amplifier 30B shuts off.

According to the present embodiment, the advantages (e.g., decreased power consumption, lowered temperature and improved offset cancellation) of the previous embodiment may be maintained, and, furthermore, chip area may be further decreased due to the sharing of the buffer stage between adjacent channels.

Although specific embodiments have been illustrated and described, it will be appreciated by those skilled in the art that various modifications may be made without departing from the scope of the present invention, which is intended to be limited solely by the appended claims.

What is claimed is:

1. A half-power buffer amplifier, comprising:
   a rail-to-rail differential amplifier;
   a buffer stage that includes a first-half buffer stage and a second-half buffer stage, wherein an output of the first-half buffer stage is controllably fed back to the rail-to-rail differential amplifier, and an output of the second-half buffer stage is controllably fed back to the rail-to-rail differential amplifier; and
   a switch network configured to control connection between the outputs of the buffer stage and an output node of the half-power buffer amplifier in a manner such that a same pixel, with respect to different frames, of a display panel is driven by the same rail-to-rail differential amplifier;
   wherein the first-half buffer stage is coupled to power at one end and coupled to half power plus a predetermined voltage ($\Delta V$) at another end, and the second-half buffer stage is coupled to the half power minus the predetermined voltage ($\Delta V$) at one end and coupled to ground at another end.

2. The half-power buffer amplifier of claim 1, wherein the rail-to-rail differential amplifier comprises an operational amplifier.

3. The half-power buffer amplifier of claim 2, wherein the operational amplifier is powered by a full-range power supply, and input voltage level of the operational amplifier is within the full range of the power supply.

4. The half-power buffer amplifier of claim 2, wherein the output of the first-half buffer stage or the output of the second-half buffer stage is controllably coupled to an inverting input node of the operational amplifier.

5. The half-power buffer amplifier of claim 1, wherein the first-half buffer stage comprises a serial-connected P-type transistor and N-type transistor, and wherein a first source/drain of the P-type transistor is coupled to the power, a second source/drain of the P-type transistor is coupled to a first source/drain of the N-type transistor, a second source/drain of the N-type transistor is coupled to the half power plus the predetermined voltage ($\Delta V$), and a gate of the N-type transistor and a gate of the P-type transistor are controlled by the rail-to-rail differential amplifier.

6. The half-power buffer amplifier of claim 5, wherein the second-half buffer stage comprises a serial-connected P-type transistor and N-type transistor, and wherein a first source/drain of the P-type transistor is coupled to the power minus the predetermined voltage (ΔV), a second source/drain of the P-type transistor is coupled to a first source/drain of the N-type transistor, a second source/drain of the N-type transistor is coupled to the ground, and a gate of the N-type transistor and a gate of the P-type transistor are controlled by the rail-to-rail differential amplifier.

7. The half-power buffer amplifier of claim 6, wherein the rail-to-rail differential amplifier comprises:
- a pair of complementary differential amplifiers having a non-inverting input node for receiving an input and an inverting input node for receiving the output of the first-half buffer stage or the output of the second-half buffer stage; and
- an amplifying stage for amplifying voltage difference between the non-inverting input node and the inverting input node.

8. The half-power buffer amplifier of claim 7, wherein the amplifying stage comprises:
- a first floating current source, associated with the first-half buffer stage, for controlling the gates of the P-type transistor and the N-type transistor in the first-half buffer stage; and
- a second floating current source, associated with the second-half buffer stage, for controlling the gates of the P-type transistor and the N-type transistor in the second-half buffer stage.

9. The half-power buffer amplifier of claim 8, wherein each of the first floating current source and the second floating current source comprises a parallel-connected N-type transistor and P-type transistor with their sources/drains respectively connected at a first node and a second node, wherein the first node and the second node are respectively coupled to the gates of the P-type transistor and the N-type transistor of the associated first-half or second-half buffer stage.

10. A half-power buffer amplifier having multiple channels, and comprising:
- a rail-to-rail differential amplifier for each channel;
- a buffer stage associated with the rail-to-rail differential amplifier of the same channel, said buffer stage including a first-half buffer stage and a second-half buffer stage, wherein an output of the first-half buffer stage is controllably fed back to the rail-to-rail differential amplifier of the same channel, and an output of the second-half buffer stage is controllably fed back to the rail-to-rail differential amplifier of the same channel; and
- a switch network associated with the rail-to-rail differential amplifier of the same channel, said switch network including:
  - a first switch connected between the output of the first-half buffer stage and an output of the same channel, and
  - a second switch connected between the output of the second-half buffer stage and the output of the same channel,
  - wherein the switch network is controlled in a manner such that a same pixel, with respect to different frames, of a display panel is driven by the rail-to-rail differential amplifier of the same channel;
- wherein the first-half buffer stage is coupled to power at one end and coupled to half power plus a predetermined voltage (ΔV) at another end, and the second-half buffer stage is coupled to the half power minus the predetermined voltage (ΔV) at one end and coupled to ground at another end.

11. The half-power buffer amplifier of claim 10, wherein the rail-to-rail differential amplifier comprises an operational amplifier.

12. The half-power buffer amplifier of claim 11, wherein the operational amplifier is powered by a full-range power supply, and input voltage level of the operational amplifier is within the full range of the power supply.

13. The half-power buffer amplifier of claim 11, wherein the output of the first-half buffer stage or the output of the second-half buffer stage is controllably coupled to an inverting input node of the operational amplifier.

14. A half-power buffer amplifier of multiple channels, comprising:
- a rail-to-rail differential amplifier for each channel;
- a buffer stage associated with the two rail-to-rail differential amplifiers of adjacent channels, said buffer stage including a first-half buffer stage and a second-half buffer stage, wherein an output of the first-half buffer stage is controllably fed back to one of the two rail-to-rail differential amplifiers of the adjacent channels, and an output of the second-half buffer stage is controllably fed back to one of the two rail-to-rail differential amplifiers of the adjacent, channels; and
- a switch network associated with the two rail-to-rail differential amplifiers of the adjacent channels, said switch network including:
  - a first switch connected between the output of the first-half buffer stage and an output of the first of the adjacent channels,
  - a second switch connected between the output of the first-half buffer stage and an output of the second of the adjacent channels,
  - a third switch connected between the output of the second-half buffer stage and the output of the first of the adjacent channels, and
  - a fourth switch connected between the output of the second-half buffer stage and the output of the second of the adjacent channels,
  - wherein the switch network is controlled in a manner such that a same pixel, with respect to different frames, of a display panel is driven by the differential amplifier of the same channel.

15. The half-power buffer amplifier of claim 14, wherein the rail-to-rail differential amplifier comprises an operational amplifier.

16. The half-power buffer amplifier of claim 15, wherein the operational amplifier is powered by a full-range power supply, and input voltage level of the operational amplifier is within the full range of the power supply.

17. The half-power buffer amplifier of claim 15, wherein the output of the first-half buffer stage or the output of the second-half buffer stage is controllably coupled to an inverting input node of one of the two operational amplifiers of the adjacent channels.

18. The half-power buffer amplifier of claim 14, wherein the first-half buffer stage is coupled to power at one end and coupled to half power plus a predetermined voltage (ΔV) at another end, and the second-half buffer stage is coupled to the half power minus the predetermined voltage (ΔV) at one end and coupled to ground at another end.

* * * * *